US011094834B2

(12) United States Patent
Liu et al.

(10) Patent No.: US 11,094,834 B2
(45) Date of Patent: Aug. 17, 2021

(54) JUNCTION FIELD EFFECT TRANSISTOR (JFET) STRUCTURE AND METHODS TO FORM SAME

(71) Applicant: GLOBALFOUNDRIES U.S. Inc., Santa Clara, CA (US)

(72) Inventors: Qizhi Liu, Lexington, MA (US); Vibhor Jain, Williston, VT (US); John J. Pekarik, Underhill, VT (US); Judson R. Holt, Ballston Lake, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/790,084

(22) Filed: Feb. 13, 2020

(65) Prior Publication Data

US 2021/0091236 A1    Mar. 25, 2021

Related U.S. Application Data

(60) Provisional application No. 62/905,005, filed on Sep. 24, 2019.

(51) Int. Cl.
| | |
|---|---|
| *H01L 21/00* | (2006.01) |
| *H01L 29/808* | (2006.01) |
| *H01L 29/06* | (2006.01) |
| *H01L 29/10* | (2006.01) |
| *H01L 29/08* | (2006.01) |
| *H01L 21/02* | (2006.01) |
| *H01L 21/225* | (2006.01) |
| *H01L 29/66* | (2006.01) |

(52) U.S. Cl.
CPC .... *H01L 29/8083* (2013.01); *H01L 21/02381* (2013.01); *H01L 21/2257* (2013.01); *H01L 29/0692* (2013.01); *H01L 29/0847* (2013.01); *H01L 29/1066* (2013.01); *H01L 29/66893* (2013.01)

(58) Field of Classification Search
CPC .......... H01L 29/8083; H01L 21/02381; H01L 21/2257; H01L 29/0692; H01L 29/0847; H01L 29/1066; H01L 29/66893
See application file for complete search history.

(56) References Cited

U.S. PATENT DOCUMENTS

| | | | |
|---|---|---|---|
| 4,373,253 A | 2/1983 | Khadder et al. | |
| 6,307,223 B1 | 10/2001 | Yu | |
| (Continued) | | | |

*Primary Examiner* — Richard A Booth
(74) *Attorney, Agent, or Firm* — Hoffman Warnick LLC

(57) ABSTRACT

A junction field effect transistor (JFET) structure includes a doped polysilicon gate over a channel region of a semiconductor layer. The doped polysilicon gate has a first doping type. A raised epitaxial source is on the source region of the semiconductor layer and adjacent a first sidewall of the doped polysilicon gate, and has a second doping type opposite the first doping type. A raised epitaxial drain is on the drain region of the semiconductor layer and adjacent a second sidewall of the doped polysilicon gate, and has the second doping type. A doped semiconductor region is within the channel region of the semiconductor layer and extending from the source region to the drain region, and a non-conductive portion of the semiconductor layer is within the channel region to separate the doped semiconductor region from the doped polysilicon gate.

7 Claims, 8 Drawing Sheets

(56) References Cited

U.S. PATENT DOCUMENTS

| | | |
|---|---|---|
| 6,861,303 B2 | 3/2005 | Hao et al. |
| 7,645,654 B2 | 1/2010 | Vora |
| 7,670,889 B2 | 3/2010 | Pekarik et al. |
| 9,184,305 B2 * | 11/2015 | Kizilyalli ............ H01L 29/1066 |
| 9,536,789 B1 * | 1/2017 | Cheng ................ H01L 27/0886 |
| 2005/0237404 A1 | 10/2005 | Jerdev et al. |
| 2014/0231883 A1 * | 8/2014 | Esteve ................ H01L 29/8083 |
| | | 257/265 |
| 2014/0332858 A1 | 11/2014 | Chen et al. |
| 2019/0058042 A1 * | 2/2019 | Then .................. H01L 29/2003 |

* cited by examiner

US 11,094,834 B2

JUNCTION FIELD EFFECT TRANSISTOR (JFET) STRUCTURE AND METHODS TO FORM SAME

BACKGROUND

1. Technical Field

The present disclosure provides a junction field effect transistor (JFET) structure, and related methods.

2. Background Art

In integrated circuit (IC) structures, a transistor is a critical component for implementing proposed circuitry designs. Numerous functions can be implemented via field effect transistors (FETs) with varying architectures. For example, the ability to control the flow of electric current between terminals of the transistor can allow the transistor to act as a switch, and therefore act as a building block for logic functions. The flow of electricity between the source and drain terminals of a transistor can be controlled by applying a voltage to the gate. A junction FET, or JFET, refers to a field effect transistor in which a channel and its conductivity are controlled by changing the width of a non-conductive depletion region between oppositely doped gate and channel regions. Specifically, electrically shrinking the size of the depletion region will form a conductive channel to create a conductive pathway from the source and drain terminals of the transistor. As device scale continues to grow and transistor sizes continue to shrink, the methods used to form a device are of increasing importance to quality management and ensuring reliable operation.

SUMMARY

The illustrative aspects of the present disclosure are designed to solve the problems herein described and/or other problems not discussed.

Embodiments of the disclosure provide a junction field effect transistor (JFET) structure, including: a semiconductor layer including a channel region between a source region and a drain region; a doped polysilicon gate over the channel region of the semiconductor layer, the doped polysilicon gate having a first doping type, wherein the doped polysilicon gate includes a first sidewall and a second sidewall opposite the first sidewall; a raised epitaxial source on the source region of the semiconductor layer and adjacent the first sidewall of the doped polysilicon gate, the raised epitaxial source having a second doping type opposite the first doping type; a raised epitaxial drain on the drain region of the semiconductor layer and adjacent the second sidewall of the doped polysilicon gate, the raised epitaxial drain having the second doping type; a doped semiconductor region within the channel region of the semiconductor layer and extending from the source region to the drain region; and a non-conductive portion of the semiconductor layer within the channel region separating the doped semiconductor region from the doped polysilicon gate.

Further embodiments of the disclosure provide a method of forming a junction field effect transistor (JFET) structure, the method including: forming a polysilicon layer on a channel region of a semiconductor layer, the channel region being between a source region and a drain region of the semiconductor layer; forming a doped polysilicon gate by implanting a first dopant into the polysilicon layer; forming a raised epitaxial source on the source region of the semiconductor layer and a raised epitaxial drain on the drain region of the semiconductor layer; and forming a doped semiconductor region within the semiconductor layer between the raised epitaxial source and the raised epitaxial drain by implanting a second dopant into the raised epitaxial source, the raised epitaxial drain, and the semiconductor layer, the second dopant having an opposite polarity from the first dopant.

Other embodiments of the disclosure provide a method of forming a junction field effect transistor (JFET) structure, the method including: forming a dopant diffusion barrier on a channel region of the semiconductor layer, the channel region being between a source region and a drain region of the semiconductor layer; forming a polysilicon layer on the channel region of a semiconductor layer; forming a doped polysilicon gate by implanting a first dopant into the polysilicon layer; forming a raised epitaxial source on the source region of the semiconductor layer and a raised epitaxial drain on the drain region of the semiconductor layer; and forming a doped semiconductor region within the semiconductor layer between the raised epitaxial source and the raised epitaxial drain by implanting a second dopant into the raised epitaxial source, the raised epitaxial drain, and the semiconductor layer, the second dopant having an opposite polarity from the first dopant, wherein at least a portion of the semiconductor layer between the doped semiconductor region and the dopant diffusion barrier remains electrically non-conductive after forming the doped semiconductor region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
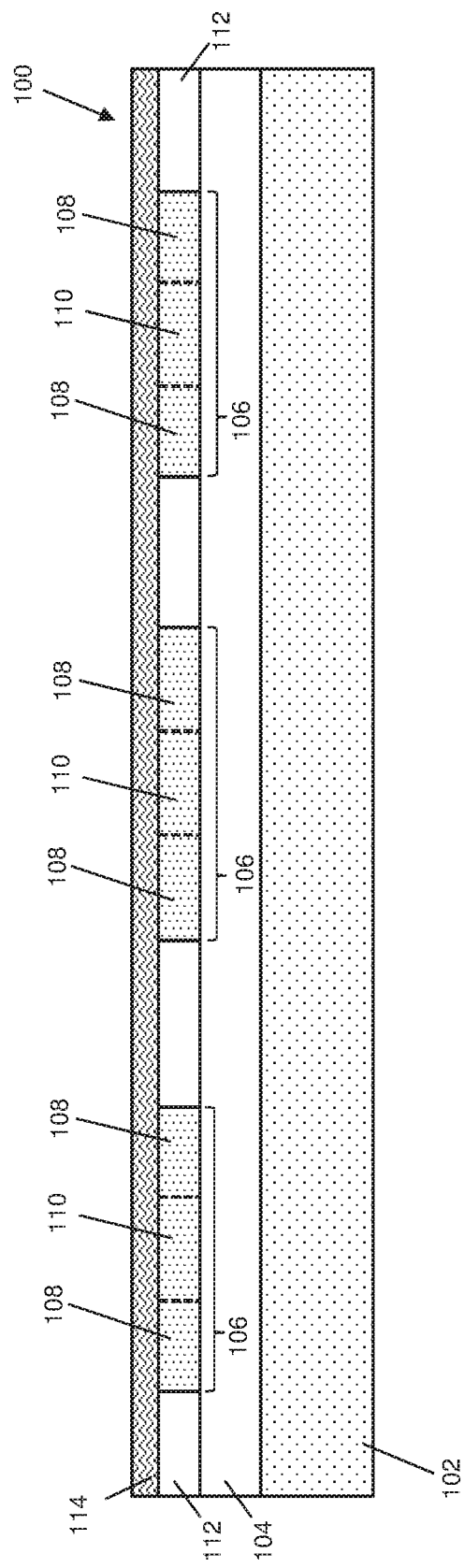
FIG. 1 shows a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Embodiments of the disclosure provide a junction field effect transistor (JFET) structure, and methods to form the same. Embodiments of the disclosure are structured for ease of structural and manufacturing integration with other types of transistor structures (e.g., planar, fin-type, and/or other FETs) on a single device or wafer. A JFET according to the disclosure may include a doped polysilicon gate over a channel region of a semiconductor layer, and in which the doped polysilicon gate is of a first doping type. A doped semiconductor region within an underlying semiconductor layer may extend horizontally below the doped polysilicon gate from a source region to a drain region. The doped semiconductor region may have a second doping type that is opposite the first doping type. A non-conductive portion of the semiconductor layer separates the doped semiconductor region from the doped polysilicon gate. During operation, voltages applied to the doped polysilicon gate will affect the size of the non-conductive portion of the semiconductor layer, thereby affecting the ability for electrical current to flow between source and drain terminals of the JFET. In some cases, the JFET structure may be formed on a same wafer or device as JFETs of a different polarity, and/or other non-JFET structures.

Referring to FIG. 1, embodiments of the disclosure provide methods to form an IC structure. FIG. 1 illustrates an initial structure 100 (simply "structure" hereafter) capable of being processed to form an IC structure according to embodiments of the disclosure. Structure 100 may be formed on a substrate 102 including, e.g., one or more semiconductor materials. Substrate 102 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained.

An insulative layer 104, also known in the art as a "buried oxide," "buried insulator," or "BOX" layer, can be located on substrate 102. Insulative layer 104 may be composed of one or more oxide compounds, and/or any other currently known or later-developed electrically insulative substances. Insulative layer 104 may be sized as narrow as possible to provide better interaction with semiconductor materials formed thereon, and in various embodiments may have a thickness that is at most approximately twenty-five nanometers (nm). Insulative layer 104 may include, e.g., silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Structure 100 can include one or more sets of semiconductor material from which multiple transistor structures may be formed. The semiconductor material can be formed in a variety of ways from an initial substrate. Various embodiments may include regions of semiconductor material in the form of a set of semiconductor layers 106 on respective portions of insulator layer 104. Semiconductor layers 106 each may be subdivided into, e.g., a set of source/drain (S/D) regions 108 and a channel region 110 between S/D regions 108. S/D regions 108 may be distinguished from channel region 110 by having a greater concentration of dopants than channel region 110 as discussed herein, and/or may otherwise be distinguished based on the materials subsequently formed thereon. FIG. 1 provides an example including three semiconductor layers 106, but structure 100 may include any desired number of semiconductor layers 106. Although semiconductor layer(s) 106 are illustrated as being semiconductor on insulator (SOI) semiconductor regions as an example, embodiments of the disclosure may be formed on any type of semiconductor region (e.g., bulk semiconductor material, fully depleted semiconductor on insulator (FDSOI) structures, fin-type field effect transistors (FinFETs), semiconductor nanosheets, etc.) without significant modifications.

A group of shallow trench isolations (STIs) 112 of structure 100, may be positioned adjacent to semiconductor layer(s) 106. STI(s) 112 may be formed of any currently-known or later developed substance for providing electrical insulation, including without limitation the example insulative materials discussed herein with respect to insulator layer 104. Each STI 112 may include a trench etched into substrate filled with insulative material, or an insulator deposited on top of substrate. STI(s) 112 isolate one region of the substrate (e.g., one semiconductor layer 106) from another region of the substrate (e.g., another semiconductor layer 106). As understood, one or more transistors of a given polarity may be disposed within an area isolated by STI(s) 112.

Semiconductor layer(s) 106 and STI(s) 112 may be covered by a pad insulator 114. Pad insulator 114 may have significantly less vertical thickness than other materials thereunder. According to an example, pad insulator 114 may have a thickness, e.g., in the range of about 50 to about 500 Angstroms (5-50 nanometers (nm)), and can be formed, for example, by thermal oxidation of the substrate. Pad insulator 114 may also be prepared by other methods. For example, silicon dioxide or reactive precursors like silane could be deposited by chemical vapor deposition (CVD). Pad insulator 114 may protect underlying materials from being inadvertently affected (e.g., removed, modified, etc.) during subsequent processing of structure 100. Pad insulator 114 may include one or more oxide-based insulators in an example implementation, but it is understood that any currently known or later developed insulative substance(s) may be used. Through insulative layer 104, STI(s) 112, and pad insulator 114, each semiconductor layer 106 of structure 100 may be physically and electrically isolated from each other.

Figure 2:
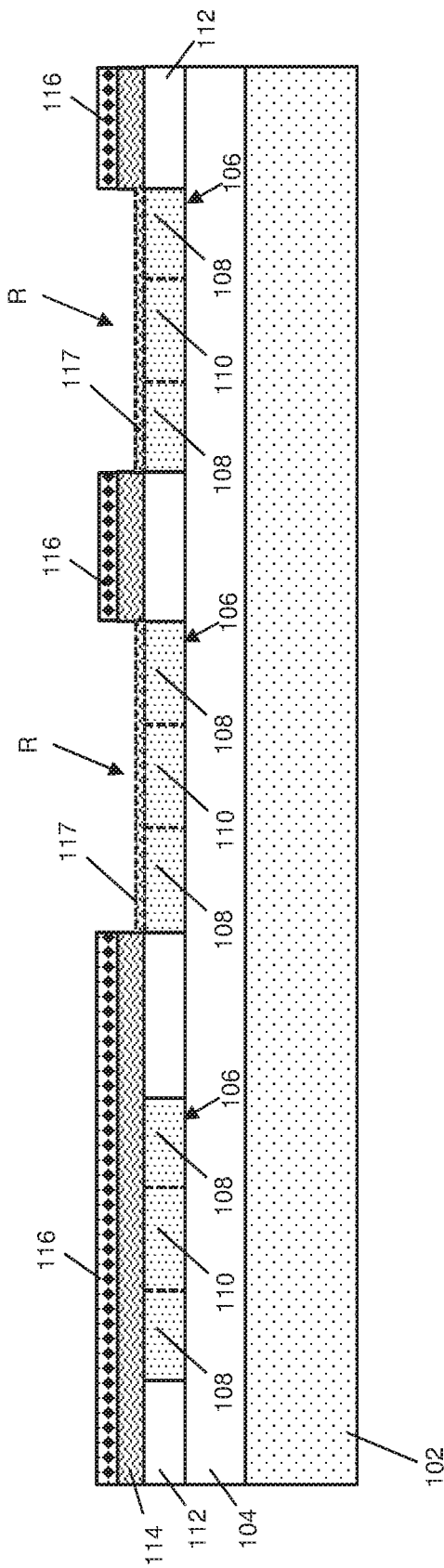
FIG. 2 shows a cross-sectional view of partially recessing an insulator layer to form a dopant diffusion barrier over a semiconductor layer according to embodiments of the disclosure.

Referring to FIG. 2, initial processing according to the disclosure may include modifying or at least partial removing of pad insulator 114 over semiconductor layer(s) 106 where JFET transistors will be formed in subsequent processing. Some embodiments of the disclosure may include forming a first mask 116 on precursor active region. First mask 116 may take the form of a pad nitride, oxide, and/or other preliminary masking material with a composition suitable to protect selected portions of underlying material from some types of downward directional etching and/or other processes to form or remove material.

Portions of pad insulator 114 targeted for removal, e.g., those not covered by mask 116, may be removed and/or recessed by etching. Etching refers to the removal of material from a substrate, e.g., substrate 102, or structures formed on the substrate. Etching is often performed with a mask (e.g., first mask 116) in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch selected crystalline materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of structure 100. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce narrow features, e.g., trenches or raised portions of a previously formed material (e.g., pad insulator 114).

According to an example, portions of pad insulator 114 not covered by first mask 116 may be completely removed, e.g., by etching, to expose semiconductor layer(s) 106. Thereafter, pad insulator 114 may be re-formed on the exposed semiconductor layer(s) 106 by rapid thermal oxidation (RTO) and/or other processes to form an oxide and/or other insulative material. In further examples, the etching time and/or etchant composition may be selected such that only a portion of pad insulator 114 (shown in phantom) is removed over semiconductor layer(s) 106. Where portions of pad insulator 114 remain over semiconductor layer 106, such portions may prevent dopants from diffusing downward in subsequent processing and/or may serve other technical purposes noted herein. Pad insulator 114 may be completely removed over semiconductor layer(s) 106. After pad insulator 114 is removed, embodiments of the disclosure may include forming a dopant diffusion barrier 117 within one or more recesses R horizontally between unaffected portions of pad insulator 114, and above semiconductor layers 106. Dopant diffusion barrier 117 may be formed of oxide and/or other insulative materials having a thickness of at most one monolayer. That is, dopant diffusion barrier 117 may include an atom-thick region of oxide materials, which may or may not extend continuously across the upper surface of semiconductor layer 106. Dopant diffusion barrier may include at most one monolayer of oxide material formed, e.g., by rapid thermal oxidation (RTO). Dopant diffusion barrier 117 may prevent dopants from vertically migrating into underlying semiconductive materials in subsequent processing.

Figure 3:
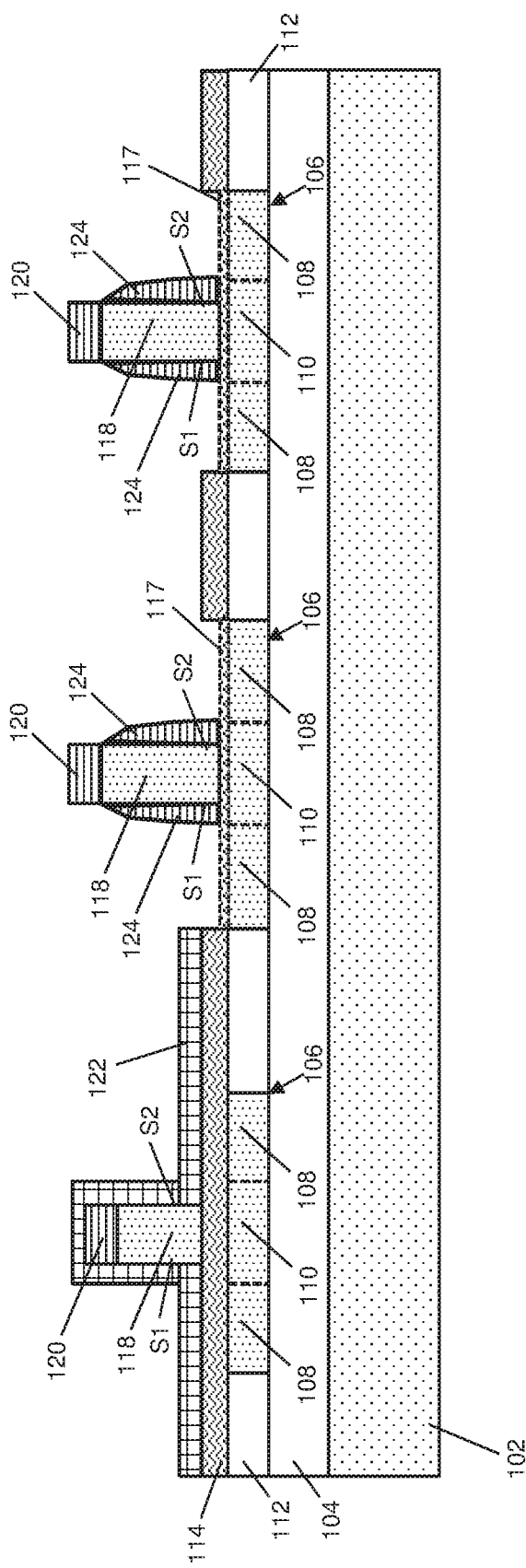
FIG. 3 shows a cross-sectional view of forming a polysilicon layer over a channel region of a semiconductor layer according to embodiments of the disclosure.

Referring now to FIG. 3, precursor materials for one or more transistor gates, including those for JFET and non-JFET structures, may be formed. Specifically, methods according to the disclosure may include forming one or more polycrystalline silicon (simply "polysilicon" hereafter) layers 118 over selected semiconductor layer(s) 106. Each polysilicon layer 118 may be formed, e.g., by a blanket film deposition onto channel region(s) 110 of semiconductor layers 106. Deposition or "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. After being formed, polyisilicon layer(s) 118 may have a thickness of, e.g., approximately eight-hundred Angstroms (Å). Additionally, each polysilicon layer 118 may have a first sidewall S1 and a second sidewall S2 on its opposing horizontal ends. Sidewall(s) S1, S2 may be defined through photolithography and subsequent etching (e.g., reactive ion etching (RIE) and/or other directional etching processes). Thus, each polysilicon layer 118 may be a freestanding structure above the material(s) where it is deposited.

Polysilicon layers 118 may not be electrically conductive at the time of their initial deposition. In some cases as noted herein, a remaining portion of first mask 116 (FIG. 2) may function as a gate dielectric layer for polysilicon layer(s) 118, while in other embodiments an additional gate dielectric layer (not shown) may be formed before polysilicon layer(s) 118 is/are formed. In other examples, portions of first mask 116 may be removed and replaced with one or more gate dielectric materials, e.g., insulators such as hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material (i.e., any material having a dielectric constant of more than 3.9) or any combination of these materials.

Embodiments of the disclosure may include forming an insulative cap 120 above polysilicon layer(s) 118. Insulative cap 120 may include any currently known or later developed insulative material including, e.g., one or more insulative materials described elsewhere herein with respect to insulative layer 104, STI(s) 112), first mask 116 (FIG. 2), dopant diffusion barrier 117, etc. In still further examples, insulative cap 120 may include a layer of one or more oxide insulators (e.g., to a vertical thickness of up to approximately eighty Å), nitride insulators (e.g., to a vertical thickness of up to approximately three-hundred A, etc. Regardless of the selected composition and/or size, insulative cap 120 may be selectively deposited, or non-selectively deposited in combination with targeted etching, or otherwise formed exclusively on the uppermost surface of polysilicon layer(s) 118. In cases where insulative cap 120 includes an oxide insulator, each insulative cap 120 may be formed by RTO as discussed elsewhere herein.

In some implementations, it may be desirable to cover selected polysilicon layer(s) 118 with etch-resistant material (s). Specifically, some polysilicon layer(s) 118 may be targeted for the subsequent forming of non-JFET structures, and thus can be left intact while other polysilicon layer(s) 118 are processed to form JFET structures as discussed herein. According to an example, embodiments of the disclosure may include forming an insulative film 122 to cover one or more polysilicon layer(s) 118, without forming insulative film 122 on other polysilicon layer(s) 118. For example, insulative film 122 may be formed by conformal deposition and subsequently may be removed by forming an intermediate mask (not shown) on polysilicon layer(s) 118 and/or other features where JFET structures are not desired, and selectively removing insulative film 122 from other polysilicon layer(s) 118. Insulative film 122 may include one or more of the example insulative materials described elsewhere herein with respect to other electrically insulative structures, and in an example may include one or more nitride-based insulators and/or oxide-based insulators. It is also understood that insulative film 122 in some cases may be formed before insulative cap(s) 120 are formed.

Embodiments of the disclosure may also include forming one or more spacers 124 adjacent to polysilicon layer(s) 118. Spacer(s) 124 may be provided as one or more bodies of insulating material formed above semiconductor layer(s) 106 by deposition/etching, thermal growth, etc. According to an example, spacers 124 may be formed initially as part of insulative film 122. Insulative film may be blanket deposited as noted elsewhere herein, and then masked with one or more photoresist materials (not shown). Such materials may be used in conjunction with downward etching (e.g., RIE) to remove portions of insulative film 122 from locations where it is not desired. However, vertical etching may not remove portions of insulative material on sidewalls of polysilicon layer(s) 118. Other portions of insulative film 122 covered by photoresist materials will remain intact during the downward etching. Afterward, the photoresist material may be stripped to thereby form spacer(s) 124 on sidewalls of selected polysilicon layer(s) 118. Spacer(s) 124 may be formed adjacent to polysilicon layer(s) 118 to electrically and physically separate polysilicon layer(s) 118 from other components. According to an example, spacer(s) 124 may be formed in pairs, with each spacer 124 being adjacent one sidewall S1, S2 of polysilicon layer 118. Spacer(s) 124 may include one or more low-K dielectric materials, i.e., dielectric materials with a dielectric constant of at most approximately 3.9. Spacer 124, for example, may include one or more insulative oxide and/or nitride materials. In some cases, spacer(s) 124 may include one or more insulative materials included in any insulative substances previously described herein, and/or a different insulative material.

Figure 4:
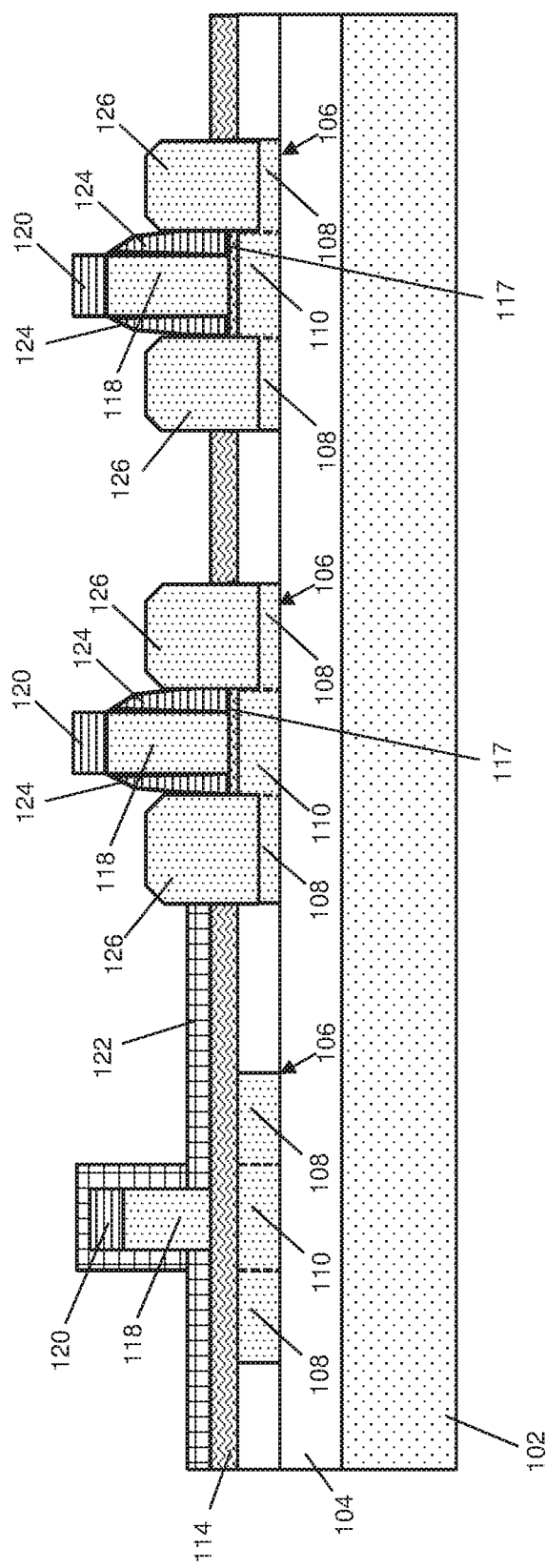
FIG. 4 shows a cross-sectional view of forming a raised epitaxial source and a raised epitaxial drain on source and drain regions according to embodiments of the disclosure.

Referring briefly to FIG. 4, embodiments of the disclosure may include forming a set of epitaxial layers 126 over S/D region(s) 108. Any remaining portions of dopant diffusion barrier 117 over targeted S/D region(s) 108 may be removed, e.g., by etching, to expose S/D regions 108 to allow epitaxial materials to be grown thereon. Epitaxial layers 126 may not be formed on semiconductor layers which continue to be covered by dopant diffusion barrier 117 and/or insulative film 122. Epitaxial layers 126 may include one or more semiconductive materials discussed herein, e.g., regarding substrate 102 and/or semiconductor layers 106. Epitaxial layers 126 in example implementations may include pure silicon (Si), silicon germanium (SiGe), and/or combinations of these materials in varying concentrations. Polysilicon layer 118 spacer(s) 124 may be located between a pair of epitaxial layers 126 to define the location of conductive terminals of a transistor structure. The forming of spacers 124 and the use of selective epitaxy to grow 126 may cause epitaxial layer(s) 126 to have a bottom surface that is below a bottom surface of polysilicon layer(s) 118. Thus, polysilicon layer 118 and epitaxial layers 126 may provide the precursor materials to form a JFET structure as discussed herein. These materials may be implanted with dopants in subsequent processing to affect their electrical properties, and thus form JFET structures in the same process flow as other transistor architectures of a device.

Figure 5:
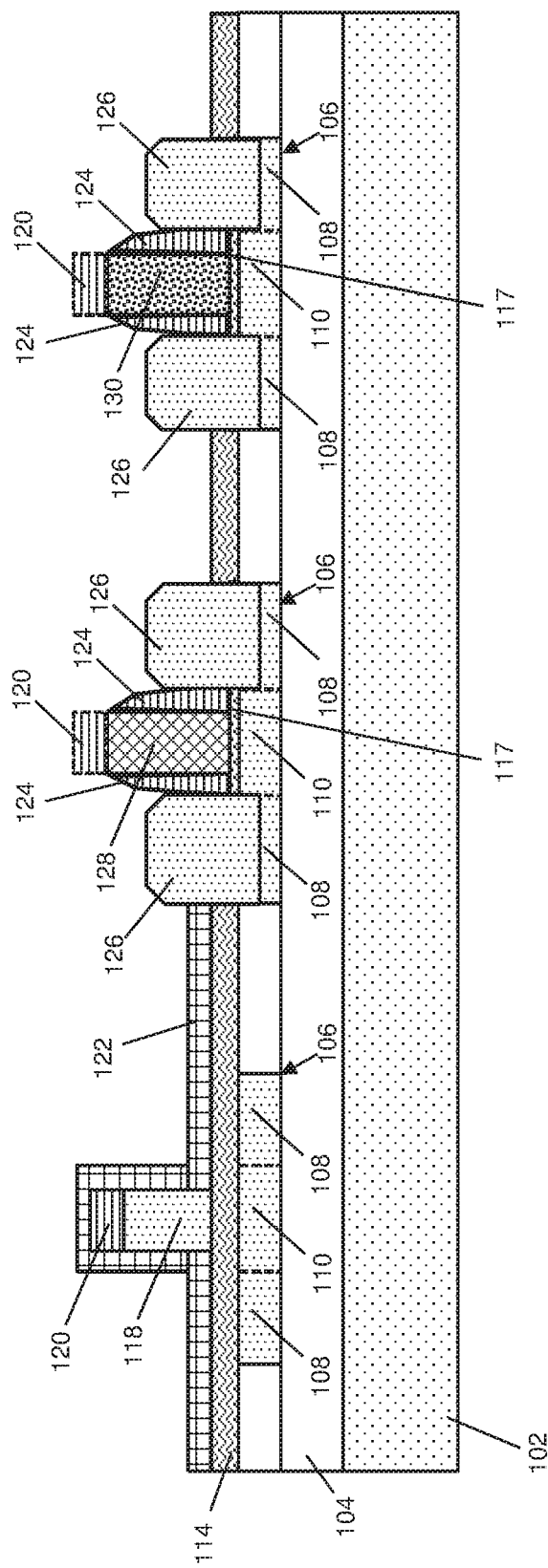
FIG. 5 shows a cross-sectional view of forming a doped polysilicon gate according to embodiments of the disclosure.

Turning now to FIG. 5, embodiments of the disclosure may include implanting dopants into one or more previously-formed materials to yield a JFET structure. A JFET structure operates by providing a pair of oppositely-doped semiconductor materials separated by a non-conductive region of semiconductor material. By applying voltages to one of the doped semiconductor materials, the non-conductive region may grow or shrink to affect passage of electricity through the other doped semiconductor material. According to an example, one or more polysilicon layers 118 may be doped before other materials, but the order in which selected materials are doped may vary between implementations.

According to an embodiment, one or more polysilicon layers 118 may become electrically conductive through the implantation of dopants. The doping of semiconductive material, e.g., selected polysilicon layer(s) 118, with P-type and/or N-type dopants is a foundational process to form a transistor. Doping is the process of introducing impurities (dopants) into the semiconductor substrate, or elements formed on the semiconductor substrate, and is often performed with a mask (or previously-formed, elements in place) so that only certain areas of the substrate will be doped. A "dopant" refers to an element introduced into a semiconductor to establish either P-type (acceptors) or N-type (donors) conductivity. Dopants are of two types: "donors" and "acceptors." N type implants are donors and P type are acceptors. In the case of a silicon substrate, common dopants may include, e.g., boron (B), and/or indium (In), for P-type doping. For N-type doping, the doped element(s) may include, for example, phosphorous (P) arsenic (As), and/or antimony (Sb). P-type and N-type doping types may themselves may be further characterized by their doping intensity relative to a baseline doping concentration for the material. P-type doped materials with an elevated number of "holes," i.e., charge carriers having a positive charge, are classified as being P+ doped. P-type doped materials carrying a greatly diminished number of electrons are classified as being P-doped. N-type doped materials with an elevated number of electrons are classified as being N+ doped. N-type doped materials carrying a greatly diminished number of holes are classified as being N− doped.

The implanting of dopants into polysilicon layer(s) 118 may form a first doped polysilicon gate 128 and/or a second doped polysilicon gate 130, each of which may be above channel region 110 of semiconductor layer 106. Two or more polysilicon layer(s) 118 may be doped with different materials and/or doping concentrations to vary the polarity of each polysilicon gate 128, 130 on a single device. In some cases, the doping of polysilicon layer(s) 118 may be performed with insulative cap 120 in place, or after insulative cap 120 is selectively removed (e.g., by etching). Insulative cap 120 is shown in phantom in FIG. 6 to indicate that it may or may not be present. In an example configuration, first polysilicon gate 128 may be doped P+ type and thus may have higher concentration of P-type dopants (e.g., In, B, etc.) than other materials that are doped P-type. In some cases, materials with a particularly high concentration of P-type dopants may be designated as "P++" materials. Additionally or alternatively, second polysilicon gate 130 may be doped N+ type and thus may have higher concentration of N-type dopants (e.g., P, As, SB, etc.) than other materials that are doped N-type. In some cases, materials with a particularly high concentration of N-type dopants may be designated as "N++" materials. In further examples, first and second polysilicon gates 128, 130 may have opposite doping types and/or the same doping types but with different concentrations, and/or any other conceivable set of doping profiles.

Figure 6:
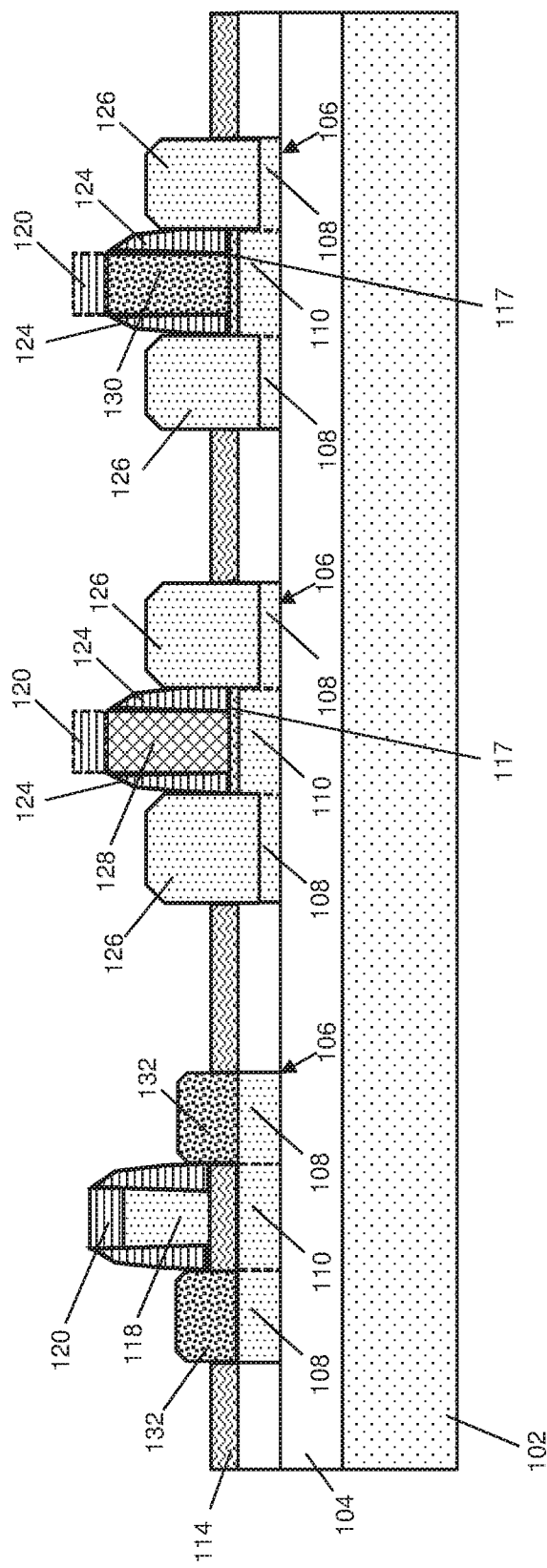
FIG. 6 shows a cross-sectional view of forming a non-JFET transistor adjacent a JFET transistor structure according to embodiments of the disclosure.

Turning to FIG. 6, embodiments of the disclosure optionally may include the processing of one or more non-JFET structures in conjunction with the processes described herein to form a JFET structure. According to an example, polysilicon gate 118 may be uncovered (i.e., insulative cap 120 and/or insulative film 122 may be removed) to re-expose polysilicon gate 118 thereunder. In further embodiments, insulative cap 120 and/or insulative film 122 may remain intact until other portions of nearby JFET structures have been formed. Where insulative cap 120 and/or insulative film 122 are removed, continued processing according to the disclosure may include forming a set of epitaxial S/D regions 132 over S/D regions 106. Epitaxial S/D regions 132 may be formed in substantially the same manner as epitaxial layers 126, and in further embodiments may be formed concurrently with epitaxial layers 126. Additionally, epitaxial S/D regions 132 may be implanted with dopants in accordance with a desired transistor specification. According to the example of FIG. 6, epitaxial S/D regions 132 may be formed to provide S/D regions of metal oxide semiconductor field effect transistor (MOSFET), in which pad insulator 114 maintains substantially its original thickness beneath polysilicon layer 118. Polysilicon layer 118 between epitaxial S/D regions 132 may be subsequently implanted with dopants and/or replaced with a metal gate structure substantially in accordance with currently known or later developed processes to form a non-JFET structure.

Figure 7:
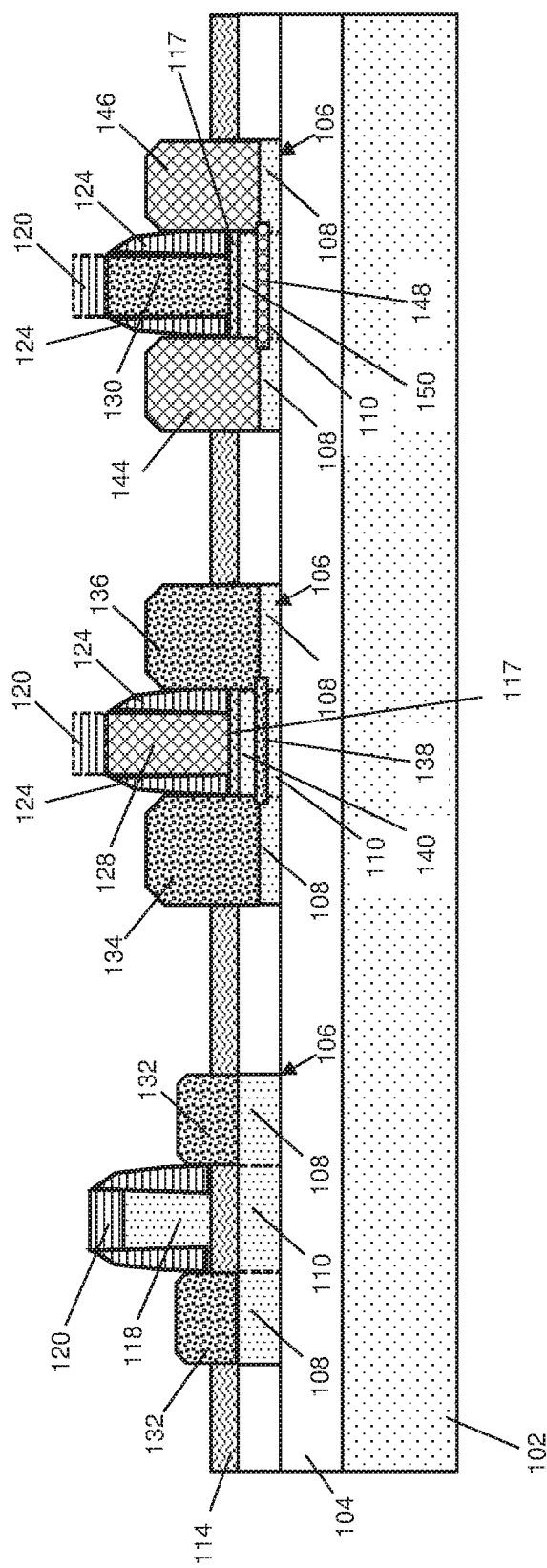
FIG. 7 shows a cross-sectional view of forming doped semiconductor region between the raised epitaxial source and raised epitaxial drain according to embodiments of the disclosure.

Referring now to FIG. 7, continued processing according to the disclosure may include further doping of semiconductive materials to form a source-channel-drain pathway for a JFET. A JFET structure may differ from other types of transistors, e.g., by including a source, drain, and channel pathway that have the opposite doping type from its corresponding gate terminal (e.g., doped polysilicon gate 128, 130). Embodiments of the disclosure can include targeted doping of semiconductor layer(s) 106 and epitaxial layers 126 (FIGS. 4-6) with opposite polarity dopants from that of doped polysilicon gates 128, 130. The doping of semiconductor layer(s) 106 and epitaxial layers 126 may be performed with insulative cap(s) 120 in place to protect against further implantation of doped polysilicon gates 128, 130. In further examples, the doping of semiconductor layer(s) 106 and epitaxial layers 126 may be performed after the removing of insulative cap(s) 120. In cases where insulative cap(s) 120 have been previously removed, the doping concentration of semiconductor layer(s) 106 and epitaxial layers 126 may be substantially less than that of doped polysilicon gates 128, 130 to prevent doped polysilicon gates 128, 130 from exhibiting the opposite doping type.

According to an example where first doped polysilicon gate 128 is doped P+ type, targeted semiconductor layer(s) 106 and epitaxial layers 126 may be implanted with N type dopants, i.e., those having an opposite doping polarity from first doped polysilicon gate 128. The implantation may form a first raised epitaxial source 134 and first raised epitaxial drain 136 on opposite horizontal ends of first doped polysilicon gate 128. The implantation may also form a first doped semiconductor region 138 below first doped polysilicon gate 128. A remaining, depleted region 140 of semiconductor region 106 vertically between first doped polysilicon gate 128 and first doped semiconductor region 138 may separate the two oppositely-doped materials from each other. During operation, depleted region 140 may act as a depletion region, which may increase or decrease in size as electrical potential is applied thereto through first doped polysilicon gate 128.

In cases where second doped polysilicon gate 130 is doped N+ type, targeted semiconductor layer(s) 106 and epitaxial layers 126 may be implanted with P type dopants, i.e., those having an opposite doping polarity from second doped polysilicon gate 130. The implantation may form a second raised epitaxial source 144 and second raised epitaxial drain 146 on opposite horizontal ends of second doped polysilicon gate 130. The implantation may also form a second doped semiconductor region 148 below second doped polysilicon gate 130. A remaining, depleted region 150 of semiconductor region 106 vertically between first doped polysilicon gate 130 and second doped semiconductor region 148 may separate the two oppositely-doped materials from each other. During operation, depleted region 150 may act as a depletion region, which may increase or decrease in size as electrical potential is applied thereto through second doped polysilicon gate 130.

Figure 8:
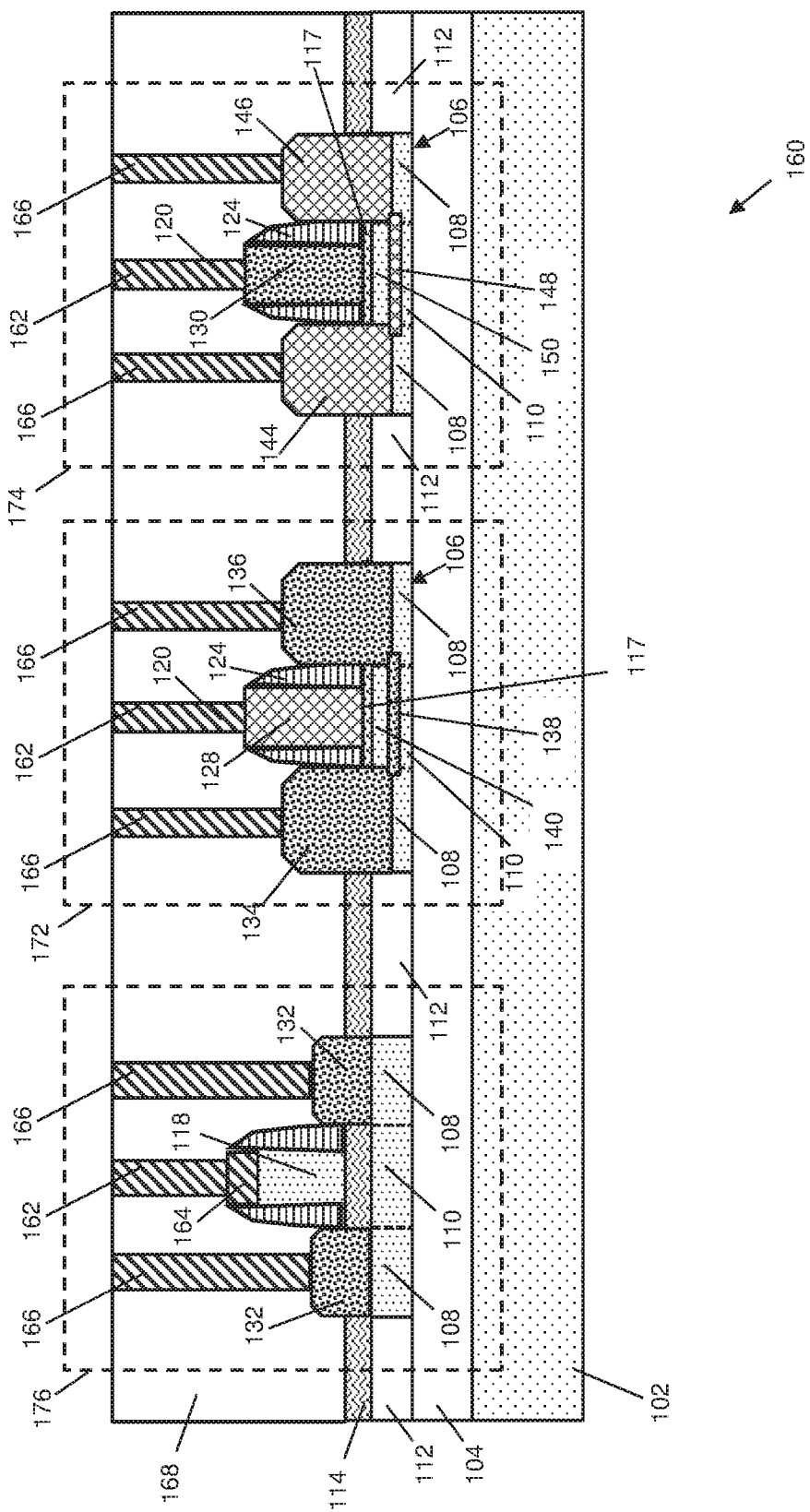
FIG. 8 shows a cross-sectional view of forming source/drain and gate contacts to JFET and non-JFET transistors according to embodiments of the disclosure.

Referring to FIG. 8, further processing of the structures described herein may yield an integrated circuit (IC) structure 160 with various transistor structures according to embodiments of the disclosure. The continued processing may include the forming of Middle of the Line (MOL) contacts. Such contacts may include one or more gate contacts 162 to a non-JFET gate 164 and S/D contacts 166 to various source and drain materials 132, 134, 136, 144, 146 described herein. Gate contact(s) 162 may be formed, e.g., by forming one or more silicide materials on source and drain materials 132, 134, 136, 146 by forming a metal layer thereon, annealing the metal such that conductive material migrates into source and/or drain materials 132, 134, 136, 146, and removing any remaining unreacted metal. Gate contact(s) 162 and/or S/D contact(s) 166 may take the form of tungsten (W) plugs. MOL processing may include, e.g., forming an inter-layer dielectric (ILD) 168 over the previously-formed materials to a desired height. ILD 138 may include one or more insulators described herein with respect to buried insulator layer 104 or pad insulator 114, and/or may include any other currently known or later developed insulative material. After ILD 138 is formed, portions of ILD 138 may be removed (e.g., by etching), and tungsten or similar materials may be deposited therein to form gate contact(s) 162 and/or S/D contact(s) 166. Thereafter, ILD 138, gate contact(s) 162, and/or S/D contact(s) 166 may be planarized (e.g., by CMP) such that the upper surfaces of these elements are substantially coplanar with each other.

After MOL processing concludes, IC structure 160 may include, e.g., a first JFET transistor 172 having a first combination of P-type and N-type doped materials, a second JFET transistor 174 having a second, opposite combination of N-type and P-type doped materials, and a non-JFET transistor 176 formed on substrate 102 but horizontally separated from transistor(s) 172, 174 at least by STI 112. Embodiments of IC structure 160 thus may include the various components formed and processed in methods according to the disclosure. For example, JFET(s) 172, 174 may include semiconductor layer 106 with channel region 110 between S/D regions 108. First or second doped polysilicon gate 128, 130 may be located over channel region 110 and may include a first doping type as described herein. JFET(s) 172, 174 may also include raised epitaxial source 134, 144 and raised epitaxial drain 136, 146 on opposite sides of doped polysilicon gate 128, 130. Semiconductor layer(s) 106 may include doped semiconductor region(s) 138, 148 with non-conductive portion 140, 150 of semiconductor layer(s) 106 being located vertically between doped semiconductor region 138, 148 and first or second doped polysilicon gate 128, 130.

Embodiments of the disclosure may provide various technical and commercial advantages, some of which are discussed herein by way of example. In some cases, embodiments of the disclosure provide a manufacturing process to form JFET transistors on the same wafer and/or device as other types of transistor structures. Additionally, embodiments of the disclosure may be integrated into existing processes to form non-JFET transistors with few changes, and with various overlapping step (e.g., epitaxial growth, gate structure formation, dopant implantation, etc.) being combinable with simultaneous processes in the forming of other transistor structures. Embodiments of the disclosure may allow a single device to implement some functions with JFET transistors while implementing other functions with non-JFET transistors. JFET transistors according to the disclosure may be particularly suitable to signal processing applications with lower tolerance for signal noise, and/or other applications where JFET transistors offer better performance, speed, reliability, etc., than non-JFET transistors.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

What is claimed is:

1. A junction field effect transistor (JFET) structure, comprising:
    a semiconductor layer including a channel region between a source region and a drain region;
    a doped polysilicon gate over the channel region of the semiconductor layer, the doped polysilicon gate having a first doping type, wherein the doped polysilicon gate includes a first sidewall and a second sidewall opposite the first sidewall;
    a raised epitaxial source on the source region of the semiconductor layer and adjacent the first sidewall of the doped polysilicon gate, the raised epitaxial source having a second doping type opposite the first doping type;
    a raised epitaxial drain on the drain region of the semiconductor layer and adjacent the second sidewall of the doped polysilicon gate, the raised epitaxial drain having the second doping type;
    a doped semiconductor region within the channel region of the semiconductor layer and extending from the source region to the drain region; and
    a non-conductive portion of the semiconductor layer within the channel region separating the doped semiconductor region from the doped polysilicon gate.

2. The JFET structure of claim 1, wherein the doped semiconductor region includes silicon (Si), and wherein the raised epitaxial source and the raised epitaxial drain each include silicon germanium (SiGe).

3. The JFET structure of claim 1, further comprising a dopant diffusion barrier vertically between the non-conductive portion of the semiconductor layer and a bottom surface of the doped polysilicon gate.

4. The JFET structure of claim 1, wherein the dopant diffusion barrier includes an oxide material having a thickness of at most approximately one monolayer.

5. The JFET structure of claim 1, further comprising a first spacer directly horizontally between the first sidewall of the doped polysilicon gate and the raised epitaxial source, and a second spacer directly horizontally between the second sidewall of the doped polysilicon gate and the raised epitaxial drain.

6. The JFET structure of claim 1, wherein a bottom surface of the doped polysilicon gate is above a bottom surface of the raised epitaxial source and a bottom surface of the raised epitaxial drain.

7. The JFET structure of claim 1, further comprising:
    a trench isolation region having a first sidewall directly horizontally adjacent to the semiconductor layer; and
    a non-JFET transistor directly horizontally adjacent to a second sidewall of the trench isolation region, opposite the first sidewall of the trench isolation region.

* * * * *